US010121681B2

(12) United States Patent
Wen

(10) Patent No.: US 10,121,681 B2
(45) Date of Patent: Nov. 6, 2018

(54) SEMICONDUCTOR PROCESSING DEVICE

(75) Inventor: Sophia Wen, Wuxi (CN)

(73) Assignee: WUXI HUAYING MICROELECTRONICS TECHNOLOGY CO., LTD, Wuxi (CN)

( * ) Notice: Subject to any disclaimer, the term of this patent is extended or adjusted under 35 U.S.C. 154(b) by 1270 days.

(21) Appl. No.: 14/111,859

(22) PCT Filed: Apr. 14, 2012

(86) PCT No.: PCT/CN2012/074053
§ 371 (c)(1),
(2), (4) Date: Oct. 23, 2013

(87) PCT Pub. No.: WO2012/139527
PCT Pub. Date: Oct. 18, 2012

(65) Prior Publication Data
US 2014/0034238 A1 Feb. 6, 2014

(30) Foreign Application Priority Data

Apr. 15, 2011 (CN) .......................... 2011 1 0094233
Apr. 15, 2011 (CN) .......................... 2011 1 0094239
Apr. 15, 2011 (CN) .......................... 2011 1 0094250
Apr. 15, 2011 (CN) .......................... 2011 1 0094306
Apr. 15, 2011 (CN) .......................... 2011 1 0094366

(51) Int. Cl.
H01L 21/67 (2006.01)
H01L 21/677 (2006.01)

(52) U.S. Cl.
CPC .... H01L 21/67023 (2013.01); H01L 21/6719 (2013.01); H01L 21/67063 (2013.01); H01L 21/67748 (2013.01)

(58) Field of Classification Search
CPC ......... H01L 21/67023; H01L 21/67748; H01L 21/67063; H01L 21/6719
(Continued)

(56) References Cited

U.S. PATENT DOCUMENTS

2004/0253747 A1* 12/2004 Wen .................. H01L 21/67051
438/14
2007/0280816 A1* 12/2007 Kurita ................... C23C 14/566
414/806
(Continued)

Primary Examiner — Jeffrie R Lund
Assistant Examiner — Mirza Israr Javed
(74) Attorney, Agent, or Firm — Han IP PLLC; Andy M. Han

(57) ABSTRACT

Embodiments of a semiconductor processing apparatus are disclosed. The semiconductor processing apparatus includes a micro chamber for tightly accommodating and processing a semiconductor wafer. The micro chamber includes an upper chamber portion defining an upper working surface and a lower chamber portion defining a lower working surface. The upper chamber portion and the lower chamber portion are relatively movable between an open position for loading and removing the semiconductor wafer and a closed position for tightly accommodating the semiconductor wafer. The semiconductor processing apparatus adopts a modified column device, a lower chamber portion and a balance correction device to achieve easy operation and maintenance, better prevention of chemical processing fluid leakage, and corrosion-resistant design.

19 Claims, 12 Drawing Sheets

(58) Field of Classification Search
USPC .......................................... 118/715, 733, 719
See application file for complete search history.

(56) References Cited

U.S. PATENT DOCUMENTS

2014/0158299 A1* 6/2014 Wen .................. H01L 21/67178
    156/345.1
2015/0079802 A1* 3/2015 Wen .................... H01L 21/6719
    438/745

* cited by examiner

SEMICONDUCTOR PROCESSING DEVICE

CROSS REFERENCE TO RELATED APPLICATIONS

This application is the U.S. national phase application of international application number PCT/CN2012/074053, filed on 14 Apr. 2012, which claims the priority benefit of China Patent Applications No. 201110094233.9. No. 201110094239.6. No. 201110094250.2 No. 201110094366.6 and No. 201110094306.4, all filed on 15 Apr. 2011. The above-identified applications are hereby incorporated by reference in their entirety.

TECHNICAL FIELD

The present invention relates to the field of surface processing of semiconductor wafers or similar workpieces, and in particular to an apparatus for chemically processing the surface of a semiconductor wafer, as well as for cleaning, etching and other processing.

BACKGROUND

Wafer is a carrier for producing integrated circuits. In actual production, the wafer to be prepared has an ultra-clean, flat surface, and the existing methods for preparing an ultra-clean wafer surface can be divided into two categories: wet processing such as immersion and spray techniques, and dry processing based on chemical vapor and plasma techniques. The wet processing is the method extensively adopted in the prior art, and it typically consists of a series of steps of immersing the wafer in or spraying the wafer with appropriate chemical solutions.

There is an apparatus in the prior art that adopts wet processing for ultra-clean wafer processing. In the apparatus, a micro chamber for tightly accommodating and processing a semiconductor wafer is formed. The micro chamber may be either opened for loading and removing the semiconductor wafer, or closed for processing the semiconductor wafer, wherein chemical reagents and other fluids can be introduced into the micro chamber during processing. The open state and the closed state are achieved in such a manner that, upper and lower two working surfaces forming the micro chamber are respectively driven by two drive devices included in the apparatus to move relatively.

But it is found in actual use that the above apparatus still has the following disadvantages: first, the structure that the upper and lower two working surfaces forming the micro chamber are respectively driven by the two drive devices in the apparatus is relatively complex, the same effect can also be achieved by applying a single drive device to drive the upper working surface or the lower working surface of the micro chamber; second, for the semiconductor wafers of different sizes, the corresponding micro chamber components of different sizes or different structures need to be replaced during processing, and it is extremely inconvenient to disassemble the whole component during replacement of the micro chamber component; third, when the micro chamber is not well sealed or leakage of chemical agents occurs in pipelines for their circulation, the relevant leakage collection mechanism in the apparatus is not perfect; and fourth, relative movement of the upper and lower two working surfaces is accomplished by a plurality of stainless metal columns that run through the upper and lower working surfaces, the columns are easily corroded by high temperature and/or corrosive gases generated during chemical processing, and accordingly become the source of metal pollution. Furthermore, the present components sleeved on the upper and lower working surface of the column are mutually welded together, so installation, debugging and disassembly of the apparatus are not easily operated, the manufacturing procedure is relatively complex, and implementation of process quality control is more difficult.

Therefore, it is necessary to provide a new solution for the above problems.

SUMMARY

An object of the present invention is to provide a semiconductor processing apparatus, which has a simpler structure, and is capable of replacing the micro chamber component more conveniently, setting the position of the micro chamber more flexibly, and collecting the leaked chemical processing fluids more safely and effectively.

According to the object of the present invention, provided in the present invention is a semiconductor processing apparatus, which includes a micro chamber for tightly accommodating and processing a semiconductor wafer. The micro chamber includes an upper chamber portion defining an upper working surface and a lower chamber portion defining a lower working surface. The upper chamber portion and the lower chamber portion are relatively movable between an open position for loading and removing the semiconductor wafer and a closed position for tightly accommodating the semiconductor wafer. When the upper chamber portion or the lower chamber portion is in the closed position, the semiconductor wafer is disposed between the upper working surface and the lower working surface, and the inner wall of the micro chamber forms gaps for one or more fluids to flow, and the upper chamber portion and/or the lower chamber portion includes at least one inlet for the one or more fluids to enter into the micro chamber and at least one outlet for discharging the one or more fluids out of the micro chamber.

In a preferred embodiment, the lower chamber portion includes a lower chamber plate defining the lower working surface and a lower box device receiving the lower chamber plate, the lower box device includes an uncovered cavity with a side opening, and through the side opening, the lower chamber plate can slide into or move out of the uncovered cavity.

In another preferred embodiment, the surface of the uncovered cavity includes guiding grooves which lead the one or more fluids to eventually flow towards the same direction. The guiding grooves include a plurality of side-by-side slope surfaces positioned on the lower surface of the uncovered cavity and having the same tilt angle and tilt mode, and the bottoms of the slope surfaces are located at the side opening.

In another preferred embodiment, the edges of the upper chamber portion and the lower chamber portion include corresponding column holes, and one of the upper chamber portion and the lower chamber portion is moveable between the open position and the closed position under the guidance of a column device running through the column holes.

In another preferred embodiment, the semiconductor processing apparatus further includes a position correction device, which can adjust the pressures of the upper chamber plate to make the gap between each part of the working surface of the upper chamber portion and the semiconductor wafer meet the predetermined width.

In another preferred embodiment, the column device includes a column and a sleeve sleeved on the outer surface of the column. The column has a threaded step-type structure, which makes it simple and flexible to accurately define the relative positions of the planes by cooperation of the nuts and the step.

Compared with the prior art, the present invention has one or several of the advantages below: First, the semiconductor processing apparatus of the present invention can drive one of the upper working surface and the lower working surface by only one drive device, as a result, the semiconductor processing apparatus of the present invention is imparted with not only a simpler structure and better user's convenience in installation and disassembly is achieved, and meanwhile, the position and shape correction module of the present invention can be utilized to accomplish adjustments of the position of the micro chamber or the relative position between the upper chamber plate and the lower chamber plate. Second, the present invention adopts the drawable upper and lower box devices to correspondingly receive the upper and lower chamber plates, which makes it convenient and easy to replace the chamber plates of different sizes. Third, as an alternative, the bottom surface of the lower box device adopted by the present invention includes a plurality of side-by-side slope surfaces having the same tilt angle and tilt mode, which can collect the leaked chemical processing fluids or other fluids at one location or one side of the lower box device, therefore, only one sensor is needed for leakage monitoring.

BRIEF DESCRIPTION OF THE DRAWINGS

The present invention will be better understood from the following detailed description when taken in conjunction with the reference drawings, in which like structural parts are identified with like reference symbols, wherein.

DETAILED DESCRIPTION OF THE PREFERRED EMBODIMENTS

For better explicitness and understanding of the above object, features and advantages of the present invention, the present invention will be further described below in details in conjunction with the drawings and the embodiments.

Figure 1:
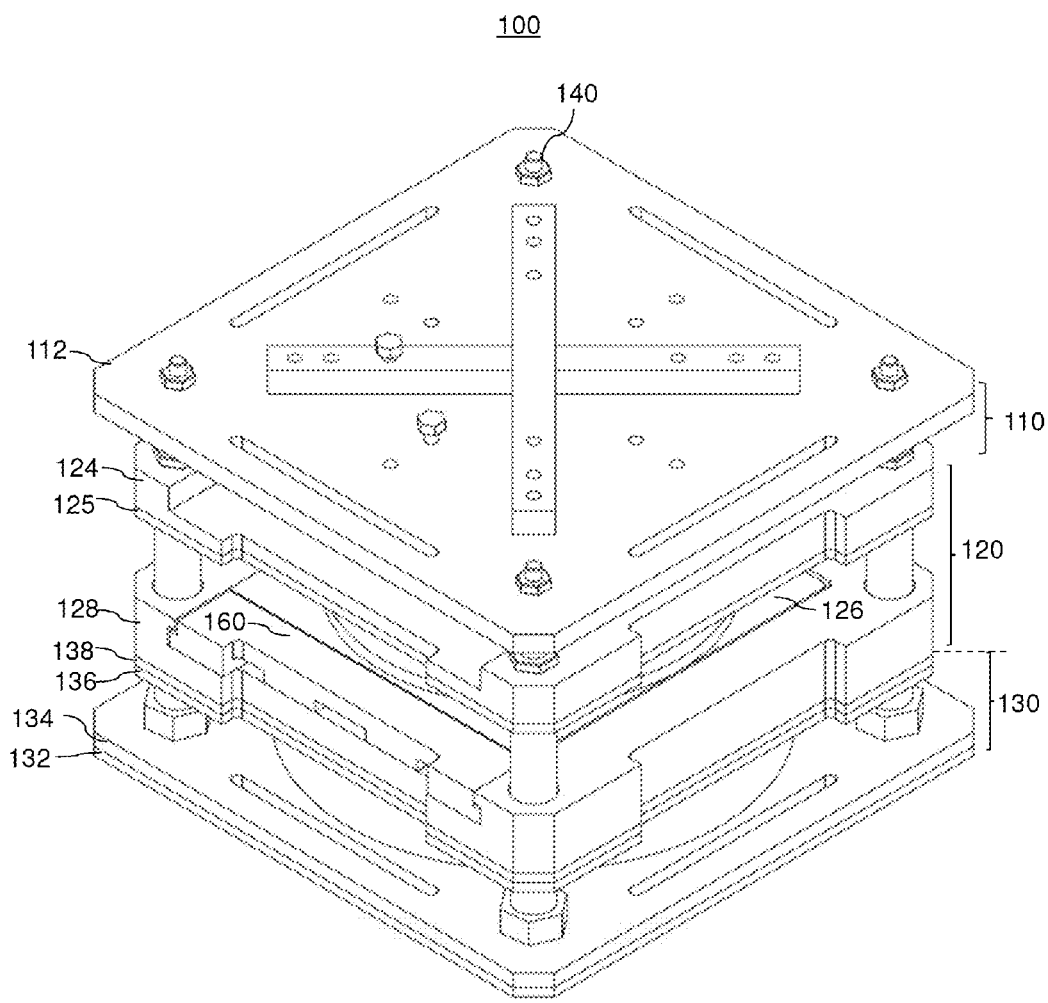
FIG. 1 is a perspective view of the semiconductor processing apparatus according to one embodiment of the present invention.
Figure 2:
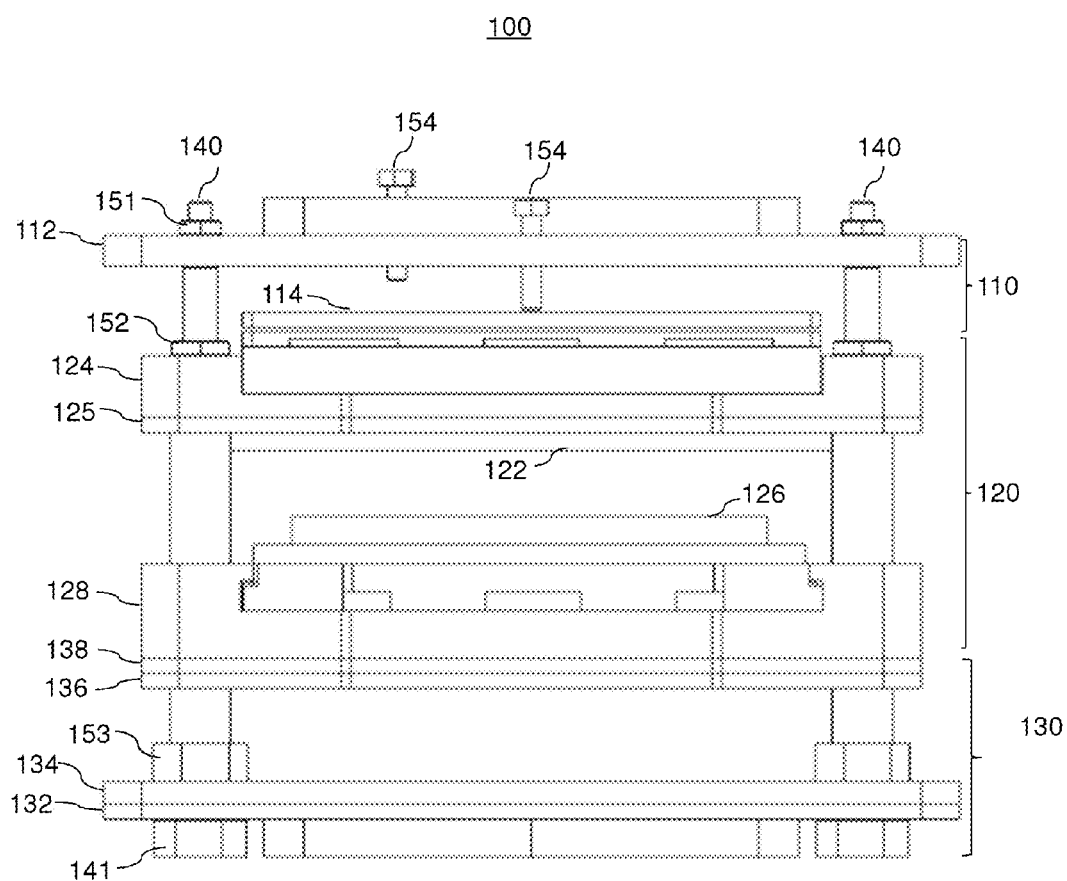
FIG. 2 is a front view of the semiconductor processing apparatus according to one embodiment of the present invention.

Refer to FIG. 1 and FIG. 2, which separately illustrates a perspective view and a front view of the semiconductor processing apparatus of the present invention in an embodiment 100. To put it simply, the semiconductor processing apparatus 100 includes a position correction device 110, a micro chamber module 120, a drive device 130 and a column device 140. Each component of the first three modules is fixed, supported or guided by four parallel column devices 140, along which there respectively are the drive device 130, the micro chamber module 120 and the position correcting device 110 from bottom to top, wherein the micro chamber module 120 includes a micro chamber for processing a semiconductor wafer. The micro chamber includes an upper chamber plate 122 supported by an upper box device 124 and limited within the upper box device 124 by the position correction device 110 located above the upper box device 124, and a lower chamber plate 126 supported by a lower box device 128, and the lower box device 128 is supported and driven by the drive device 130 located below the lower box device 128.

The drive device 130 can drive the lower box device 128 to move relative to the upper box device 124 under the guidance of the column devices 140, in order to open or close the upper box device 124 and the lower box device 128 when loading and removal of the semiconductor wafer are needed, namely open or close the micro chamber formed by the upper chamber plate 122 and the lower chamber plate 126. When the micro chamber is closed, chemical agents and other fluids can be introduced into the micro chamber for chemical cleaning, etching and other processing on the semiconductor wafer within the micro chamber, and the chemical agents and other fluids are introduced out of the micro chamber at the end of the processing.

For easiness in describing the present invention, firstly described is the drive device 130, which, from bottom to top, sequentially includes a bottom plate 132, a first middle plate 134 located above the bottom plate 132, a second middle plate 136 located above the first middle plate 134 and an upper plate 138 located above the second middle plate 136. A cavity, which is formed by the bottom plate 132, the first middle plate 134, the second middle plate 136 and the upper plate 138, further internally includes a drive (not shown). When the drive gives an upward driving force, the second middle plate 136 and the upper plate 138, under the guidance of the column device 140, drive the lower box device 128 located above the upper plate 138 and the lower chamber plate 126 to move upwardly, so as to complete change of the micro chamber from an open state to a closed state.

Figure 3:
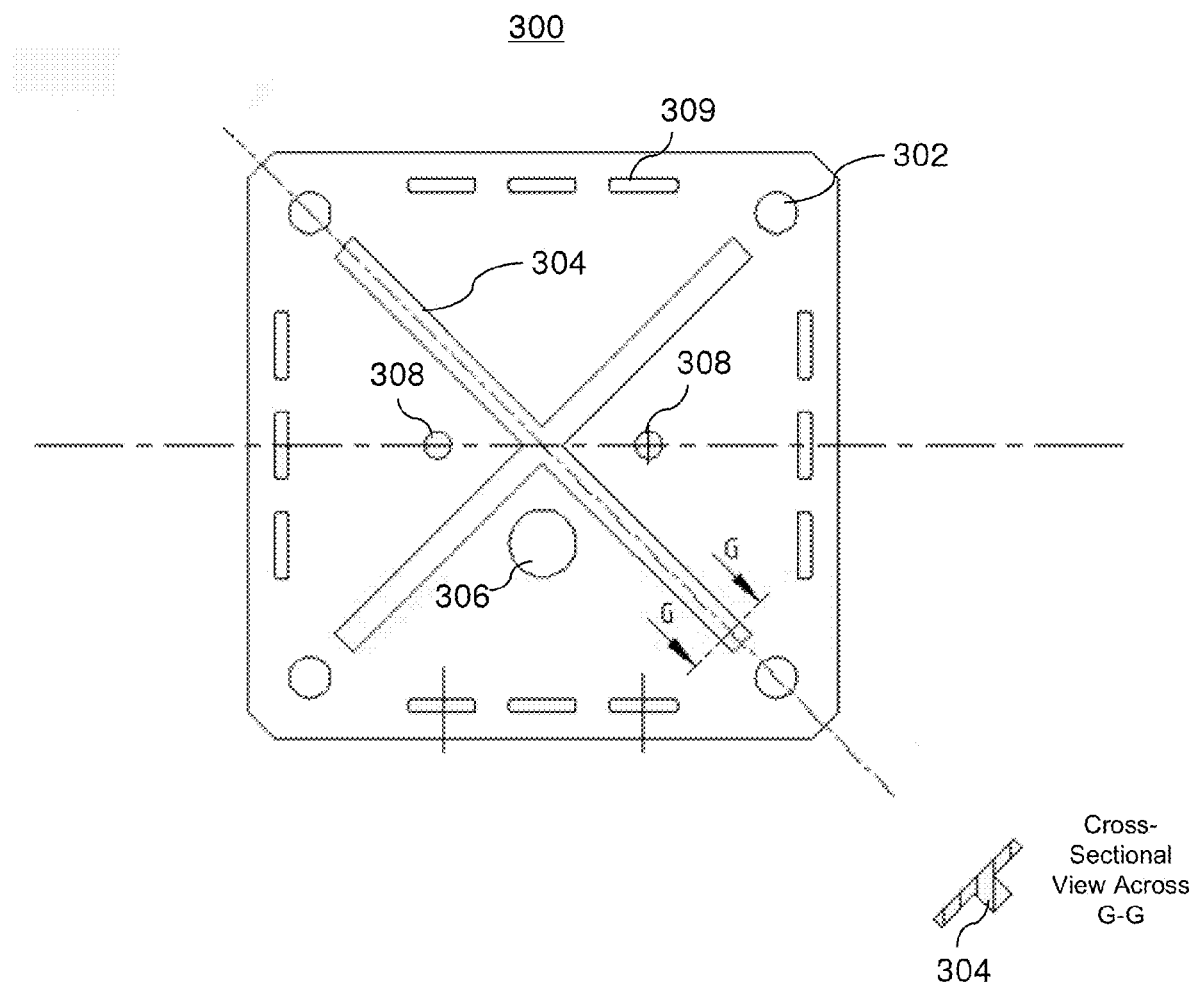
FIG. 3 is a top view of the bottom plate according to one embodiment of the present invention.

FIG. 3 is a top view of the bottom plate 132 in an embodiment 300. The shape of the bottom plate 300 is square, the four corners of the bottom plate 300 include four column holes 302 relative to the column devices 140, and by third nuts 153, the four corners of the bottom plate 300 are fixed with hexagonal bottoms 141 (shown in FIG. 2) of the column devices 140 located below the bottom plate 300. The underside of the bottom plate 300 further includes ridges 304 located on the diagonal lines of the bottom plate 300.

The cross section of the ridge 304 is rectangular and the ridges 304 provide high intensity support for the bottom plate. Near the central portion of the bottom plate 300 is a circular perforation 306 and two screw thread perforations 308. The circular perforation 306 is used for other equipment, pipelines or devices to pass through and the two screw thread perforations 308 can be used for fixation below the drive in combination with screws and other components. On the other hand, three side-by-side rectangular notches 309 are further formed on the four sides of the bottom plate 300 respectively.

Figure 4:
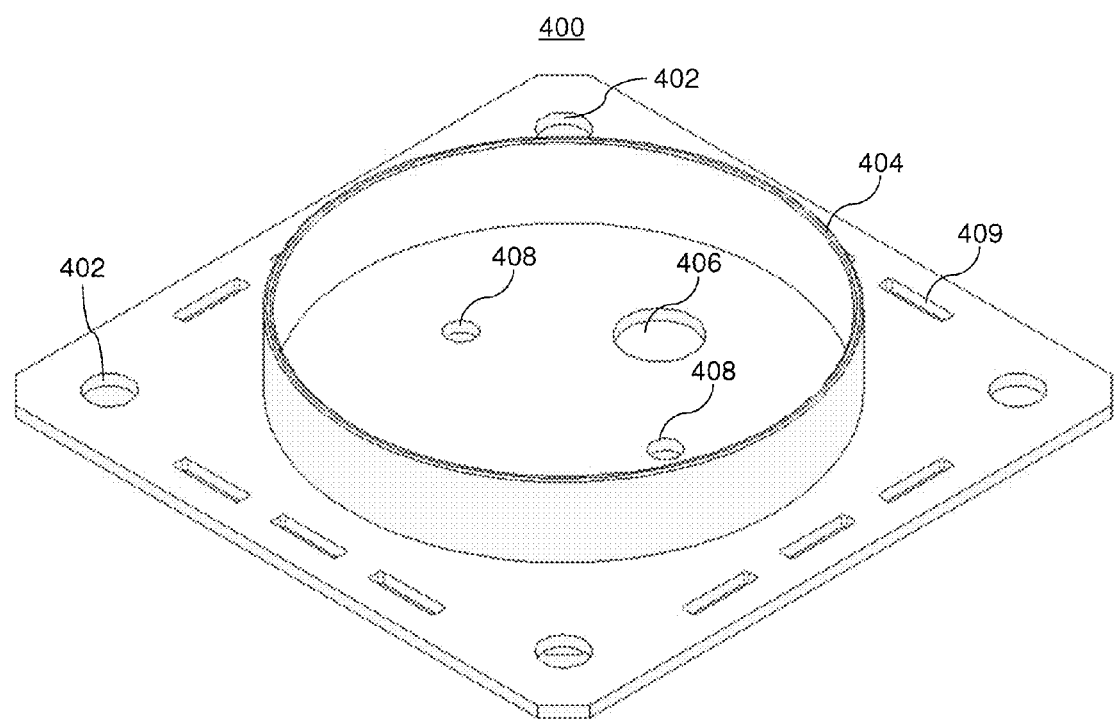
FIG. 4 is a perspective view of the first middle plate according to one embodiment of the present invention.

FIG. 4 is a perspective view of the first middle plate 134 in an embodiment 400. The shape of the first middle plate 400 is also square and the four corners of the first middle plate 400 also include four column holes 402 relative to the column devices 140, and together with the bottom plate 300, the four corners of the first middle plate 400 are fixed, by the third nuts 153, with the hexagonal bottoms 141 (shown in FIG. 1) of the column devices 140 located below the bottom plate 300. The upside of the first middle plate 400 extends perpendicularly to the plane of the first middle plate 400 to form a first circular cylinder wall 404, the volume of which is slightly larger than that of the drive, in order to receive the drive. Near the central portion of the first middle plate 400 is a circular perforation 406 and two screw thread perforations 408 relative to the bottom plate 300. The circular perforation 406 is used for other equipment, pipelines or devices to pass through and the two screw thread perforations 408 are used for fixation below the drive in combination with screws and other components. Three side-by-side rectangular perforations 309 are further formed on the four sides of the first middle plate 400 respectively.

Figure 5:
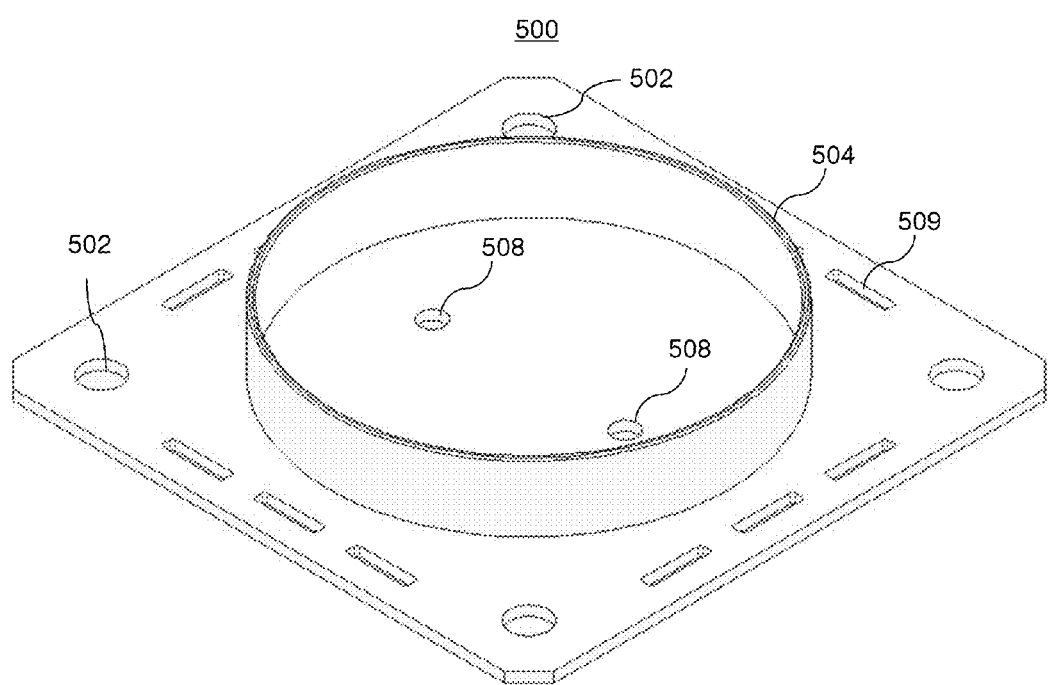
FIG. 5 is a rear perspective view of the second middle plate of the present invention in one embodiment.

FIG. 5 is a rear perspective view of the second middle plate 136 in an embodiment 500. The structure of the second middle plate 500 is substantially symmetrical with that of the first middle plate 400. The four corners of the second middle plate 500 include four column holes 502 relative to the column devices 140. The plate can move upwardly or downwardly under the guidance of the column devices 140. The underside of the second middle plate 500 (i.e. the upside shown in the drawing) extends perpendicularly to the plane of the second middle plate 500 to form a second circular cylinder wall 504, the volume of which is slightly larger than the size of the drive, in order to receive the drive. The diameter of the second cylinder wall 504 should be slightly greater than or slightly smaller than that of the first cylinder wall 404 of the first middle plate 400, so that the second cylinder wall 504 can be received or embedded in the first cylinder wall 404 as the second middle plate 500 moves toward the first middle plate 400. Near the central portion of the second middle plate 500 are two screw thread perforations 508, which can be used for fixation above the drive in combination with screws and other components. Three side-by-side rectangular perforations 509 are further formed on the four sides of the second middle plate 500 respectively.

Figure 6:
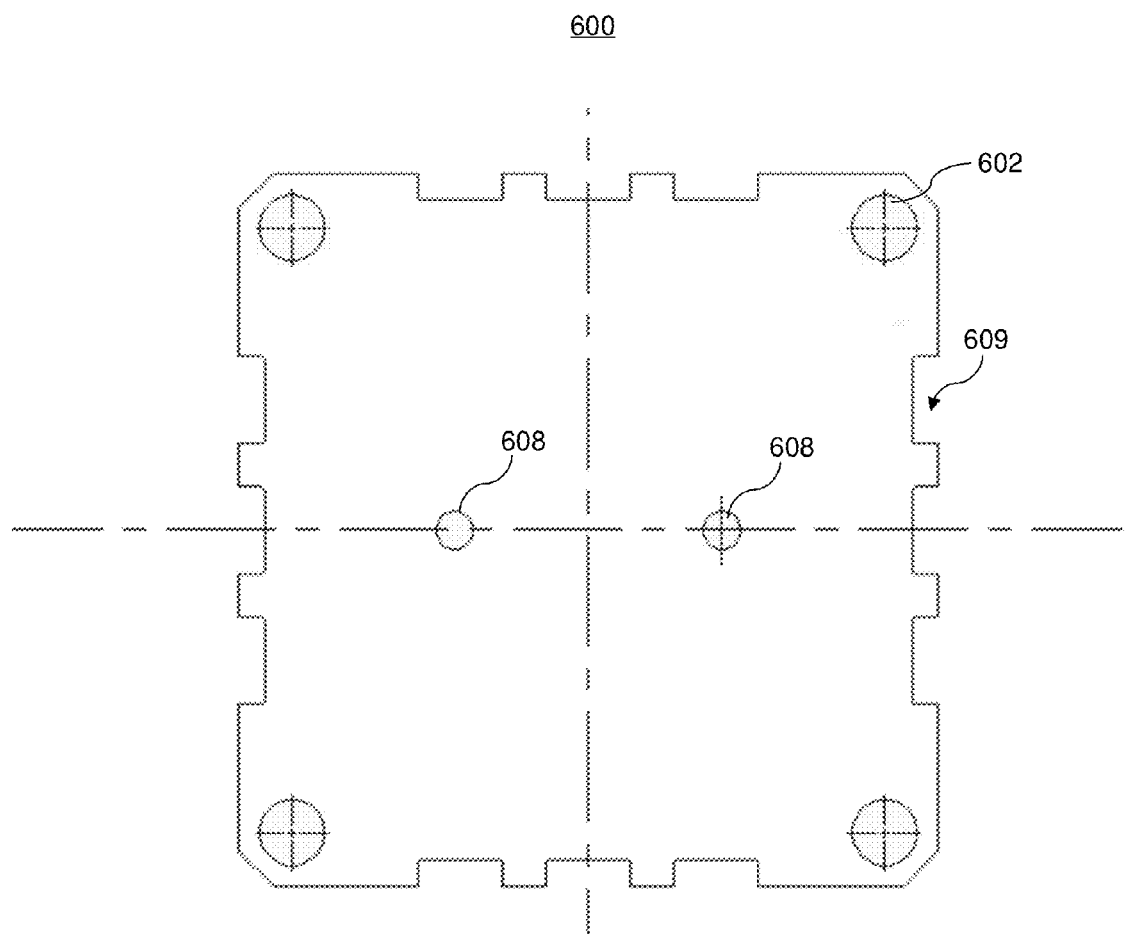
FIG. 6 is a top view of the upper plate according to one embodiment of the present invention.

FIG. 6 is a top view of the upper plate 138 in an embodiment 600. The shape of the upper plate 600 is square in correspondence to the bottom plate 300 and the four corners of the upper plate 600 include four column holes 602 relative to the column devices 140. The upper plate 600 can move upwardly or downwardly under the guidance of the column devices 140. At the centre of the upper plate 600 are two side-by-side perforations 608. The perforations 608 can be used for fixation above the drive in combination with screws and other components. Three side-by-side rectangular notches 609 are further formed on the four sides of the upper plate 600 respectively.

In conclusion, a cylindrical cavity that is formed by the bottom plate 132, the first middle plate 134, the second middle plate 136 and the upper plate 138 can receive a drive therein. The drive is a mature product in the prior art, e.g. pneumatic drive; similarly, other drives, such as mechanical drive, electric drive or hydraulic drive, can also be adopted. However, it shall be realized that, when the drive gives an upward driving force, the second middle plate 136 and the upper plate 138 are driven by the driving force of the drive to move upwardly; and when the drive gives a downward driving force, the second middle plate 136 and the upper plate 138 are driven by the driving force of the drive and own gravity to move downwardly.

It can be easily thought of that, in another embodiment, the bottom plate 132 and the first middle plate 134 can be integrally formed as one bottom plate; the second middle plate 136 and the upper plate 138 can be combined into one top plate. That is to say, the drive device 130 is not limited to the embodiments described above, but to any other embodiments that could reach identical or better effects.

Described next is the micro chamber module 120 as shown in FIG. 1 and FIG. 2. The micro chamber module 120 sequentially includes, from bottom to top, a lower box device 128, a lower chamber plate 126 supported by the lower box device 128, a partition 125, an upper box device 124 located above the partition 125 and an upper chamber plate 122 supported by the upper box device 124. The lower box device 128 and the lower chamber plate 126 supported by the lower box device 128 can be driven by the drive device 130 to move upwardly or downwardly under the guidance of the column devices 140. The partition 125, the upper box device 124 located above the partition 125 and the upper chamber plate 122 supported by the upper box device 124 are usually motionless, only the position and shape of the micro chamber can be slightly adjusted by the position correction device 110, which will be hereinafter described in details. After the lower box device 128 and the lower chamber plate 126 supported by the lower box device 128 are driven by the drive device 130 to move upwardly under the guidance of the column devices 140 and then closed with the upper chamber plate 122 and the upper box device 124, the micro chamber is formed.

Figure 7:
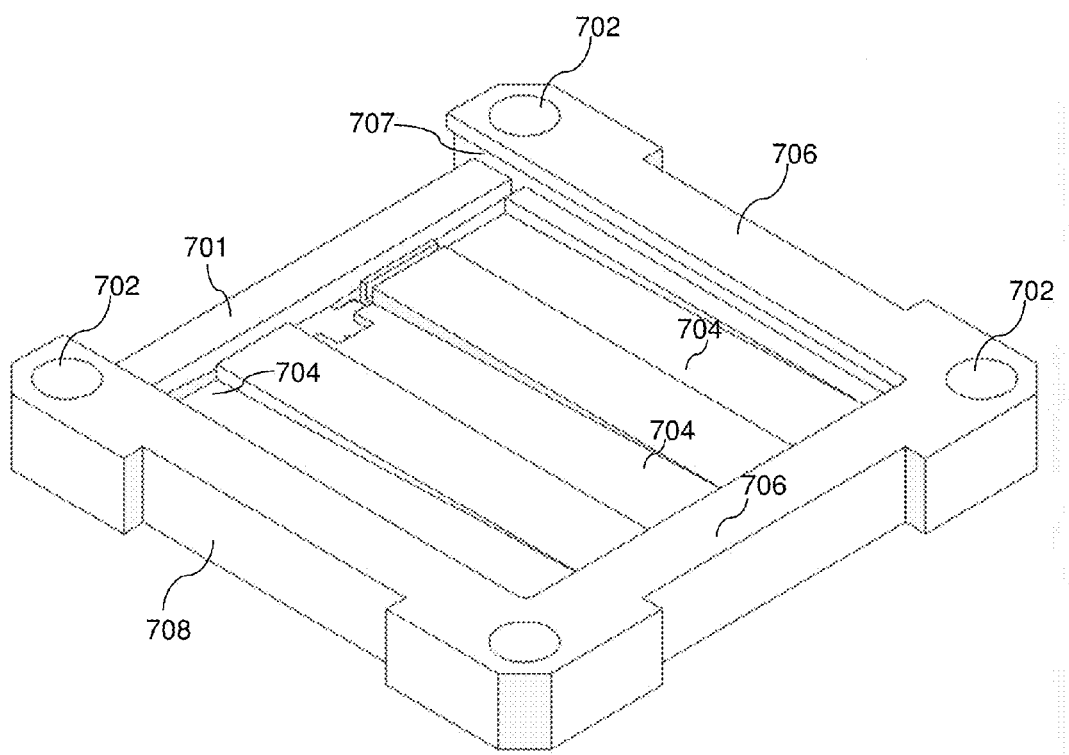
FIG. 7 is a perspective view of the lower box device according to one embodiment of the present invention.

FIG. 7 is a perspective view of the lower box device 128 in an embodiment 700. The lower box device 700 is substantially in the shape of an uncovered box with a square bottom surface. The four corners of the lower box device 700 include four column holes 702 relative to the column devices 140. Three side-by-side slope surfaces 704 with the same tilt angle, tilt mode and width are arranged on one surface of the lower box device 700 relative to the upper box device 124, such a design of the bottom surface including the slope surfaces is employed for collecting chemical agents or other fluids leaked from the lower chamber plate located above the bottom surface. Through the above slope surfaces, chemical agents or other fluids can finally flow to the bottoms of the slope surfaces 704. When the leaked chemical processing fluids or other fluids come into contact with sensors for liquids or other fluids arranged on the slope bottoms, the sensors give an alarm signal, meanwhile, a series of protection measures are initiated according to the predesigned scheme to avoid leakage expansion and ensure the safety of equipment and operating staff. Then, the leaked fluids can be collected by guiding grooves, holes, pipelines or storage boxes connected to the slope bottoms of the slope surfaces 704.

Meanwhile, it shall be appreciated that the box wall portion the slope bottoms of the odd slope surfaces 704 face is missing, and the inner wall portions where three other box walls 706 come into contact with the bottom surface 701 are recessed in the horizontal direction to form grooves 707. Through the missing box wall portion, the lower chamber plate 126 can horizontally slide into the lower box device 700 along the grooves 707 on the other box walls 706 and then be supported by the bottom surface 701. Likewise, the lower chamber plate 126, when located within the lower box device 700, can also slide out of the lower box device 700 along the grooves 707 through the missing box wall portion. Rectangular notches 708 are further formed on the four sides of the lower box device 700 respectively.

Figure 8:
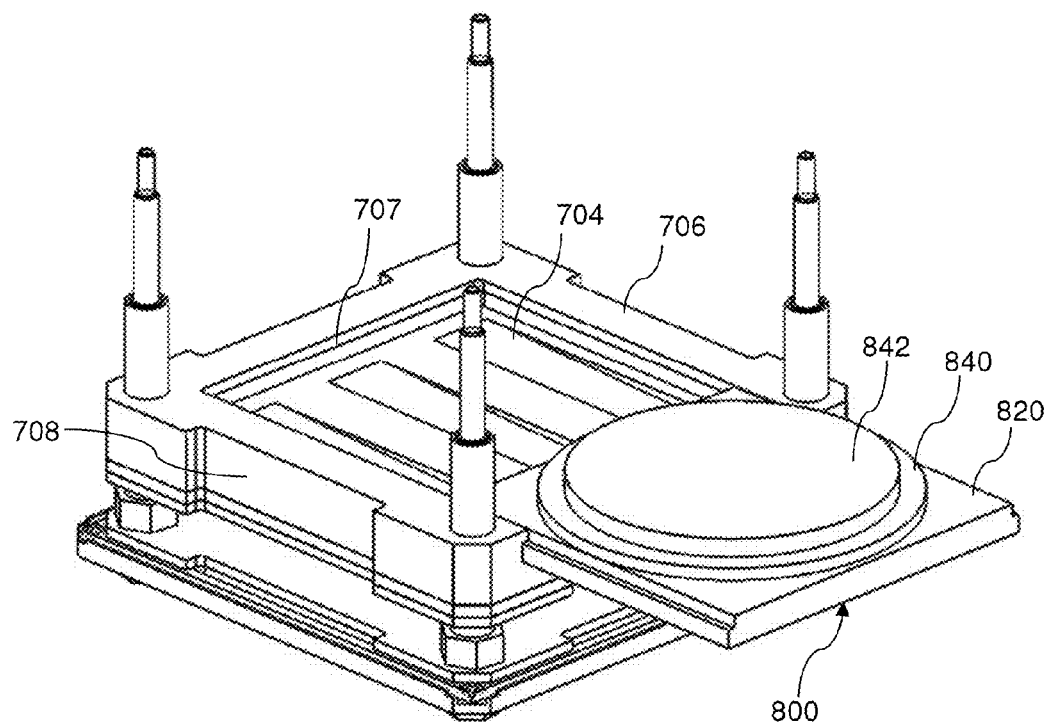
FIG. 8 is an assembly view of the lower chamber plate and the lower box device according to one embodiment of the present invention.

Refer to FIG. 8, which illustrates an assembly view of the lower chamber plate 126 and the lower box device 700 in an embodiment 800. The lower chamber plate 800 is typically integrally formed. The lower chamber plate 800 includes a lower portion 820 and an upper portion 840 located above the lower portion 820. The size and the edge thickness of the lower portion 820 correspond to the distance between the box walls 706 of the lower box device 700 and to the width of the groove 707 respectively, so that the lower chamber plate 800 can slide along the grooves 707 on the box walls 706 of the lower box device 700. The upper surface 842 of the upper portion 840 serves as the lower working surface of the micro chamber.

Figure 9:
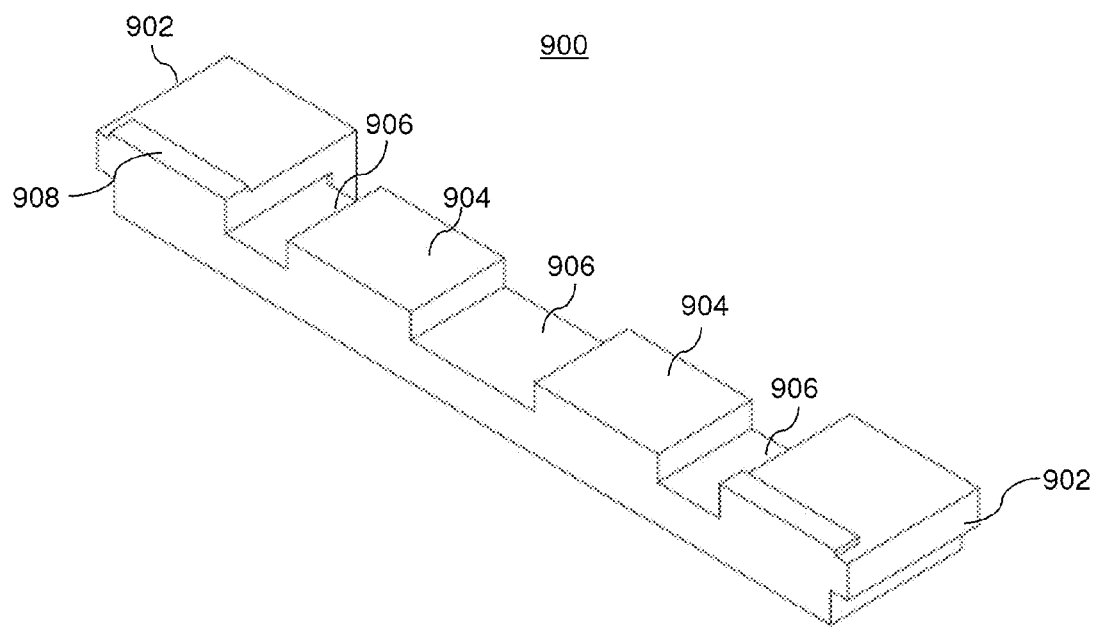
FIG. 9 is a rear perspective view of the insert component according to one embodiment of the present invention.

It shall be appreciated that, it is very convenient to load and remove the lower chamber plate 800 since the lower chamber plate 800 slides in or out in a drawable manner. There are different semiconductor wafer sizes, such as 4 inches, 6 inches, 8 inches, 12 inches, etc., furthermore, for better processing effects, there is a need to design different interior structures of the micro chamber according to different processing technologies, for example, the micro chamber for cleaning the patterned wafer surface or the micro chamber for cleaning the chemically-mechanically polished wafer surface. Therefore, if needed, the lower chamber plate can be replaced by a matching one according to either different wafer sizes or process requirements. Simultaneously, when the lower chamber plate 800 slides into the lower box device 700, an insert component 160 (shown in FIG. 1) can also be utilized to engage the lower chamber plate 800 in the lower box device 700. FIG. 9 illustrates a rear perspective view of the insert component 160 in an embodiment 900. The two sides of the insert component 900 include convex ribs 902 relative to the grooves 707 of the lower box device 700. The bottom of the insert component 900, i.e. the upside shown in the drawing, includes bulges 904 relative to the even slope surfaces and pits 906 relative to the odd slope surfaces, thus the insert component 900 is corresponding to the bottom structure of the lower box device 700. The insert component 900 further includes stop blocks 908 located above the bottom surface. When the insert component 900 is engaged in the lower box device 700, the stop blocks 908 can be engaged with the wall which corresponds to the slope bottoms of the slope surfaces 704 of the lower box device 700, in order to prevent the insert component 900 from falling off the lower box device 700. When there is a need to remove the insert component 900, the insert component 900 can be lifted up at first until it is drawn out of the lower box device 700. Obviously, the lower chamber plate 800 can be fixed within the lower box device 700 by means of the fixation effect from the insert component 900.

Figure 10:
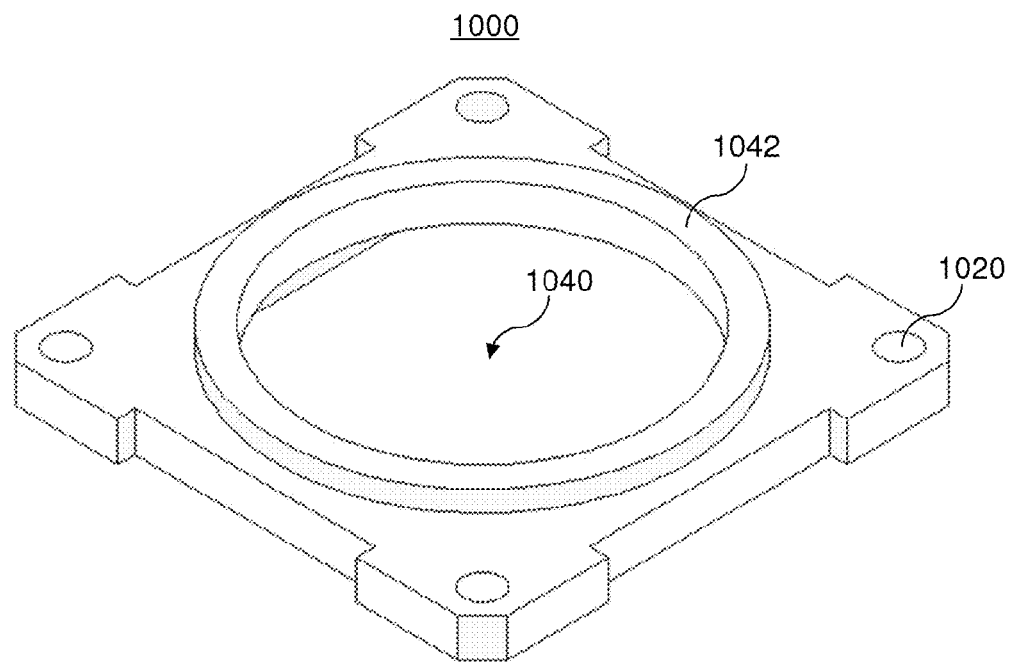
FIG. 10 is a perspective view of the upper box device according to one embodiment of the present invention.
Figure 11:
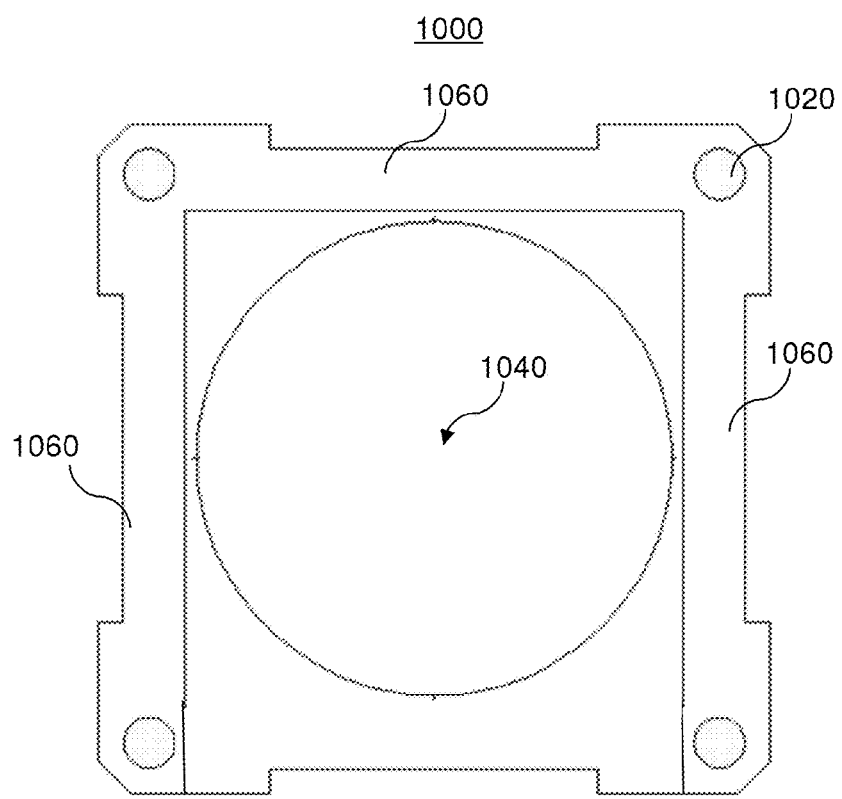
FIG. 11 is a top view of the upper box device according to one embodiment of the present invention.

The upper chamber plate 122 basically has a structure that is substantially symmetrical with the lower chamber plate 800. The upper chamber plate 122 includes a square upper portion and a disk-shaped lower portion. Since those skilled in this art can easily think of the structure of the upper chamber plate 122 from FIG. 8, the relevant drawings of the upper chamber plate 122 are omitted herein. Obviously, the side length of the square upper portion of the upper chamber plate 122 and the diameter of the disk-shaped lower portion can be the same as or close to those of the lower chamber plate 800, and the lower surface of the lower portion serves as the upper working surface of the micro chamber. It shall be appreciated that, when the upper working surface of the lower chamber plate 800 and the lower working surface of the upper chamber plate are closed or closely attached, a cavity for receiving the semiconductor wafer is formed therein. FIG. 10 and FIG. 11 respectively illustrate a perspective view and a top view of the upper box device 124 in an embodiment 1000. The upper box device 1000 is substantially in the shape of an uncovered box with a square bottom. The four corners of the upper box device 1000 respectively include four column holes 1020 relative to the column devices 140. At the central portion of the bottom of the upper box device 1000 is a circular cavity 1040 slightly larger than the lower portion of the upper chamber plate. The circular cavity 1040 includes a circumferential convex rib 1042 downwardly extending out of the bottom. And a structure capable of tightly accommodating the upper chamber plate 122 is formed by a box-shaped space that includes three box walls 1060 and is matched with the upper portion of the upper chamber plate 122. Through this structure, the upper chamber plate 122 can be steadily supported by the upper box device 1000. In addition, the structure of the upper box device 1000 with no box wall at one side also makes it convenient to replace the upper chamber plate 122. Likewise, if needed, the upper chamber plate 122 can be replaced by a matching one according to either different wafer sizes or process requirements, and the specific replacement procedure will be described below in details.

Figure 12:
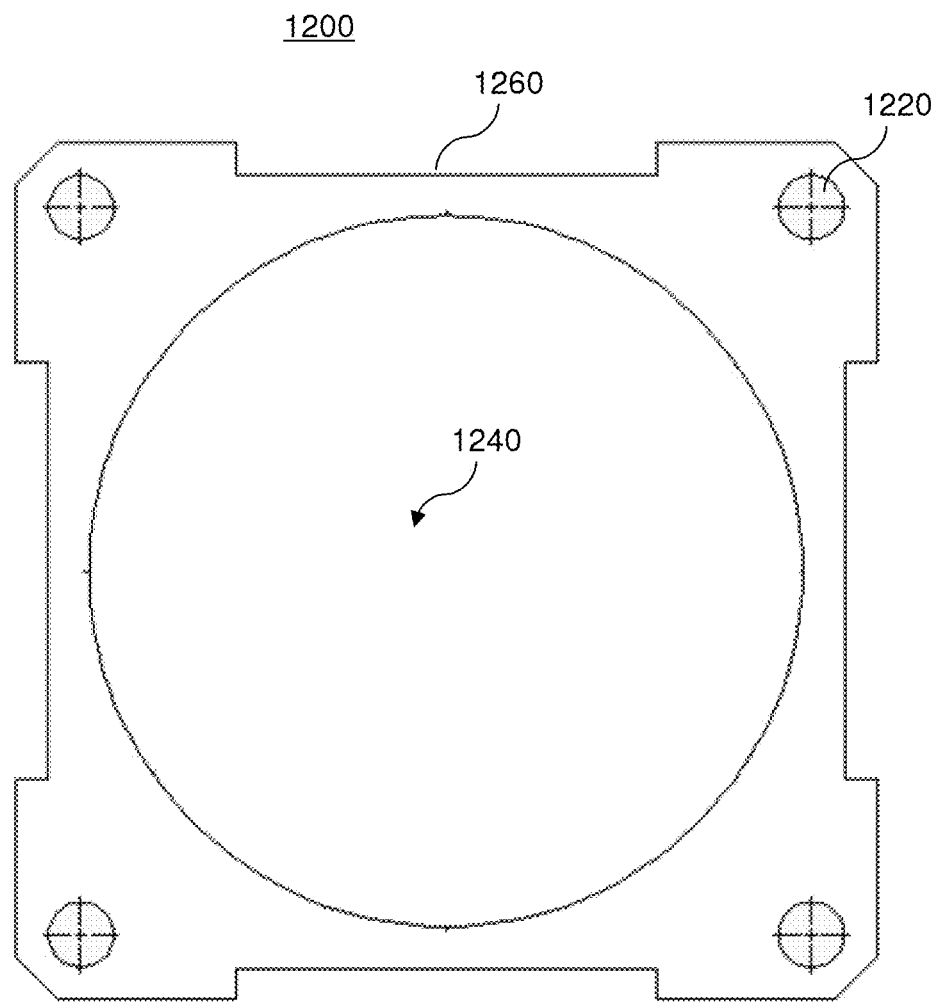
FIG. 12 is a top view of the partition according to one embodiment of the present invention.

FIG. 12 is a top view of the partition 125 in an embodiment 1200. The shape of the partition 1200 is square and the four corners of the partition 1200 include four column holes 1220 relative to the column devices 140. At the central portion of the partition 1200 is a circular notch 1240 capable of tightly accommodating the circumferential convex rib 1042 of the upper box device 1000. The primary function of the partition 1200 is to support the upper box device 1000 located above the partition 1200 and the upper chamber plate 122 received within the upper box device 1000. Rectangular notches 1260 are further formed on the four sides of the partition 1200 respectively, and can be utilized to receive pipelines and install other components, such as valves, flow controllers and sensors. In one embodiment, the partition 1200 can be made of a stainless steel material.

Figure 13:
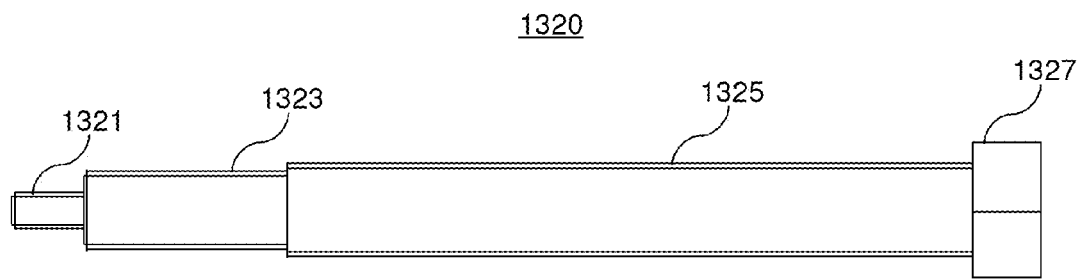
FIG. 13 is a front view of the column according to one embodiment of the present invention.
Figure 14:
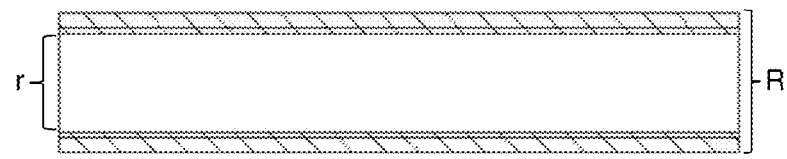
FIG. 14 is a cross-sectional view of the sleeve according to one embodiment of the present invention.

For further description of the position relation between each of the above plates and the column device 140, refer to FIG. 13 and FIG. 14 at first, which respectively illustrate a front view and a cross-sectional view of the column and the corresponding sleeve included in the column device 140 in an embodiment 1300. The column 1320 includes a cylindrical upper portion 1321 with the smallest diameter, a cylindrical first middle portion 1323 with the smaller diameter, a cylindrical second middle portion 1325 with the larger diameter, and a bottom 1327 having a hexagonal section (141 shown in FIG. 2). The outer surface on the top of the upper portion 1321 further includes a first screw thread with the predetermined length (not shown). The outer surface of the end, near the upper portion 1321, of the first middle portion 1323 further includes a second screw thread with the predetermined length (not shown). The outer surface of one end, near the hexagonal bottom 1327, of the second middle portion 1325 further includes a third screw thread with the predetermined length (not shown). The internal diameter r of the sleeve 1340 is slightly larger than or equal to the diameter of the second middle portion 1325 of the column 1320. In case that the sleeve 1340 is sleeved on the column 1320, that is, the column device 140 is assembled, refer to FIG. 1 and FIG. 2 together. After the sleeve 1340 and the column 1320 are assembled, the internal diameter or the shortest distance of the cross section of the column device 140 decreases successively from bottom to top, that is, the shortest distance of the section of the bottom 1327>the external diameter R of the sleeve 1340>the internal diameter r of the sleeve 1340>the external diameter of the second middle portion 1325>the external diameter of the first middle portion 1323>the external diameter of the upper portion 1321. In one embodiment, the first middle plate 134 and the bottom plate 132 can also be installed above the bottom 1327 of the column; the internal diameter of the column holes on the first middle plate 134 and the bottom plate 132 is slightly larger than the external diameter of the second middle portion 1325 of the column 1320; and by the third nuts 153 relative to the third screw threads, the first middle plate 134 and the bottom plate can be fixed between the third nuts 153 and the bottom 1327 of the column. The internal diameter of the column holes of the second middle plate 136, the upper plate 138 and the lower box device 128 is slightly larger than the external diameter of the sleeve 1340, that is to say, the column holes of the second middle plate 136, the upper plate 138 and the lower box device 128 can receive the sleeve 1340 and the second middle portion 1325 located within the sleeve 1340, and the height of the lower box device 128 does not exceed the upper edge of the second middle portion 1325 or the sleeve 1340, in this case, the second middle plate 136, the upper plate 138 and the lower box device 128 can be driven by the drive to move up and down along the sleeve 1340 and the second middle portion 1325 located within the sleeve 1340. By the second nuts 152 relative to the second screw threads, the partition 125 and the upper box device 124 can be fixed between the second nuts 152 and the upper edge of the second middle portion 1325 or the sleeve 1340. The internal diameter of the column holes of the partition 125 and the upper box device 124 is slightly larger than the diameter of the first middle portion 1323, but not larger than the external diameter of the second middle portion 1325. That is to say, the lower surface of the partition 125 does not move downwardly as being supported by the second middle portion 1325 and the upper edge of the sleeve 1340.

Referring to FIG. 1 and FIG. 2, the position correction device 110 includes a correction plate 114 located above the upper chamber plate 122 and a top plate 112 located above the correction plate 114. The internal diameter of the column holes on the four corners of the top plate 112 is slightly larger than the diameter of the upper portion 1321 of the column and smaller than the diameter of the first middle portion 1323, therefore, the top plate 112 can be fixed between the first nuts 151 and the upper edge of the first middle portion 1323 by the first nuts 151 relative to the first screw threads. Particularly, the column 1320 can be made of metals or alloys by cutting and casting, and the sleeve 1340 can be made of corrosion-resistant and high-temperature-resistant materials, such as plastics.

Figure 15:
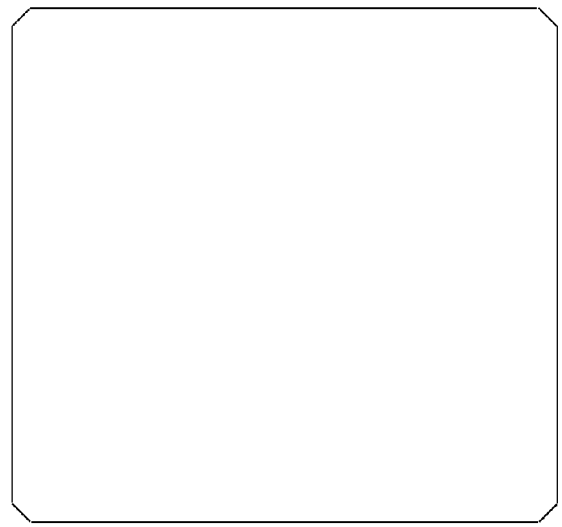
FIG. 15 is a bottom view of the correction plate according to one embodiment of the present invention.
Figure 16:
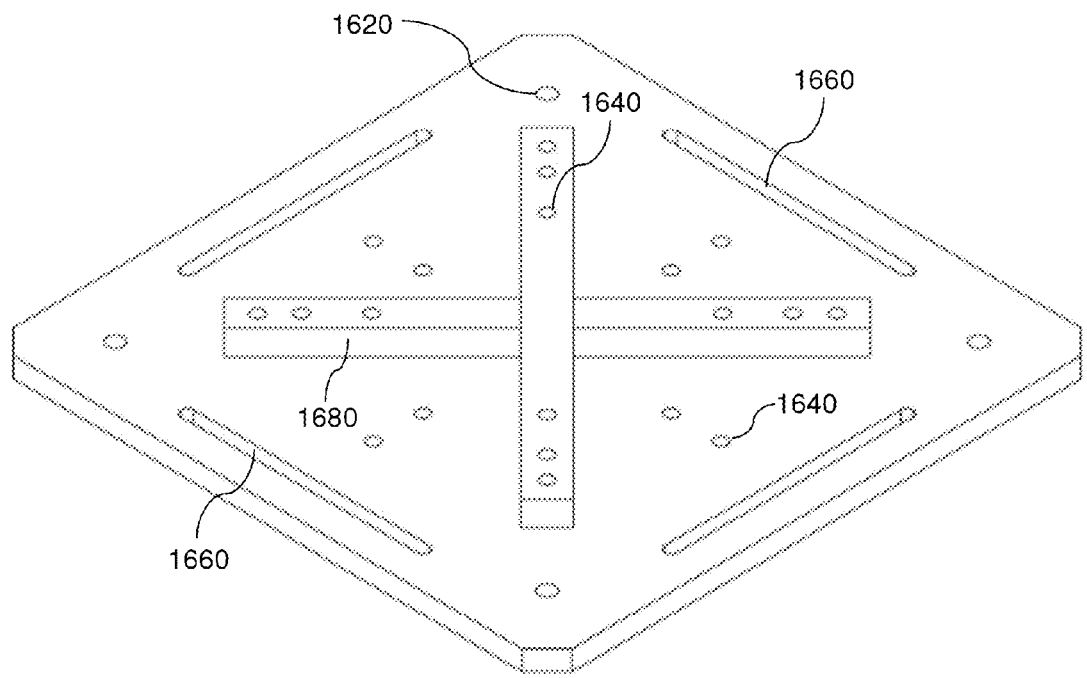
FIG. 16 is a perspective view of the top plate according to one embodiment of the present invention.

For further description of the position correction device 110, refer to FIG. 15 and FIG. 16. FIG. 15 is a bottom view of the correction plate 114 of the present invention in an embodiment 1500. The correction plate 1500 is a flat plate, which is similar to the upper portion of the upper chamber plate 122 in size. The correction plate 1500 can be pressed on the upper portion of the upper chamber plate 122.

FIG. 16 is a perspective view of the top plate 112 of the present invention in an embodiment 1600. The four corners of the top plate 1600 include column holes 1620, the internal diameter of which is slightly larger than the diameter of the upper portion 1321 of the column and smaller than the diameter of the first middle portion 1323. By the first nuts 151 relative to the first screw threads, the top plate 1600 can be fixed between the first nuts 151 and the upper edge of the first middle portion 1323 of the column. A plurality of threaded holes 1640 with the same internal diameter are further formed on the diagonal lines and the mid-point connection lines of the opposite sides of the top plate 1600. It can be seen from FIG. 2 that, after the bolts 154 relative to the threaded holes 1640 are screwed into the top plate 1600, the distal ends of the bolts 154 can exert pressures on the parts of the correction plate 114 located below the top plate 1600. That is to say, the bolts 154 with different screwed widths at different screwed positions can be used to exert different pressures on different parts of the correction plate 1500. Through certain measurement methods, the pressure generated below the correction plate 1500 not only causes the upper chamber plate 122 to be closely received in the upper box device 124, but also imparts the lower working surface of the upper chamber plate 122 with an appropriate shape. That is to say, the gaps between the lower working surface of the upper chamber plate 122 and the semiconductor wafer to be processed are adjusted by the pressure provided by the correction plate 1500 to accord with the process requirements. The middle portions of the four sides of the top plate 1600 all include elongated bar-shaped perforations 1660 for receiving pipelines or installing other components. The top plate 1600 further includes reinforcing ribs 1680, wherein a part of the threaded holes 1640 are located on the reinforced ribs 1680.

In conclusion, the position correction device 110 can put the lower surface of the upper chamber plate 122 under an appropriate fixed state, and the drive device 130 can make the upper surface of the lower chamber plate 126 move downwardly or upwardly, so that the micro chamber formed by the lower surface of the upper chamber plate 122 and the upper surface of the lower chamber plate 126 is under an open or closed state. Certainly, in order to obtain a sealed micro chamber, the lower surface of the upper chamber plate 122 and the upper surface of the lower chamber plate 126 may adopt corresponding jointing or coupling structures. The joints of the upper chamber plate 122, the upper box device 124, the lower chamber plate 126 and the lower box device 128 can also employ sealing components such as rubber-made O sealing ring, etc. Meanwhile, in order to allow chemical agents or other fluids to enter into and be discharged out of the micro chamber, the upper chamber plate 122 and the lower chamber plate 126 should further have inlet and outlet structures, such as hollow micro pipes and guiding grooves. For instance, when a semiconductor wafer needs to be located within the micro chamber, a gap for circulation of the chemical agents is formed between the semiconductor wafer and the inner wall of the micro chamber, and the predetermined width of the gap is usually in the range from 0.01 mm to 10 mm. The above parts that are not described in details herein are all familiar to those skilled in this art and therefore not repeatedly described herein.

In one specific embodiment, when the semiconductor processing apparatus 100 of the present invention is used to process a semiconductor wafer, the processing procedure can be substantially divided into several parts below: replacement of the chamber plate, position correction and chemical processing.

During replacement of the chamber plate, the chamber plate can be replaced by a matching one according to the size of the semiconductor wafer to be processed or the process requirements. Replacement of the lower chamber plate 126 is as follows: at first, the drive gives a downward driving force to lower the lower box device 128 and the lower chamber plate 126, then the insert component 160 is opened or pulled out, and the old lower chamber plate 126 is taken out by sliding it along the guiding grooves of the lower box device 128. The new proper lower chamber plate 126 is installed in by sliding it along the guiding grooves of the lower box device 128, and the insert component 160 is installed to fix the lower chamber plate 126 within the lower box device 128.

Replacement of the upper chamber plate 122 is as follows: the drive gives a downward driving force to lower the lower box device 128 and the upper chamber plate 122, all the bolts 154 are screwed off so that the bolts 154 are no longer pushed against the correction plate 114, afterwards, the correction plate 114 is removed, the old upper chamber plate 122 is lifted up from the inside of the upper box device 124, the upper chamber plate 122 is taken out, the new upper chamber plate 122 is put in the upper box device 124, the correction plate 114 is arranged above the new upper chamber plate 122, and finally, the correction plate 114 is fixed and adjusted by the bolts 154 to complete correction or adjustment of the new upper chamber plate 122.

During position correction, the position of the upper chamber plate 122 relative to the lower chamber plate can be corrected. First, the second nuts 152 above the four corners of the upper box device 124 can be adjusted to exert appropriate pressures on the four corners of the upper box device 124, thus preliminarily adjusting the position of the upper chamber plate 122. Then, the existing horizontal measuring device is utilized or the micro chamber under the closed state is observed, pressure distribution on the correction plate 114 can be accurately adjusted by adjustment of the plurality of bolts 154 installed on the top plate 112 according to the measurement result or the observation result, so that the upper chamber plate 122 is under a state which meets the process requirements. Certainly, in some embodiments, the upper chamber plate 122 probably needs to be adjusted to be at a certain tilt angle, in order to facilitate corresponding processing of the semiconductor wafer, in this case, the adjustment way of the upper chamber plate 122 could be easily thought of from the foregoing description.

During chemical processing, the drive device 130 is utilized at first to close the micro chamber, and then chemical agents or other fluids are introduced into the micro chamber through hollow micro pipes within the upper chamber plate 122, in order to perform processing on the semiconductor wafer inside, such as analysis and etching, afterwards, by the pressure or suction inside, such as gas transportation or generation, the chemical agents or other fluids are driven in vacuum to be discharged out through the structures like hollow micro pipes or guiding grooves within the lower chamber plate 126. The contents of this part are familiar to those skilled in this art. Particularly, the structures like hollow micro pipes and guiding grooves need to be taken into account in designing the upper chamber plate 122 and the lower chamber plate 126, the upper chamber plate 122 and the lower chamber plate 126 may have multiple variations and more complex structures according to specific embodiments and do not completely correspond to the descriptions of the upper chamber plate 122 and the lower chamber plate 126 herein, thus, the differences relevant to this shall not be considered as a factor for limiting the scope of the present invention.

One of the advantages and essentials of the present invention is that: typically adopted in such semiconductor processing apparatuses in the prior art is a structure that an upper drive device and a lower drive device are used for driving the upper chamber plate 122 and the lower chamber plate 126 respectively. However, adopted in the present invention is the position correction device 111 for replacing the drive device located at the upper portion in the prior art, which not only achieves a simpler structure of the present invention, but also facilitates the operations of a user.

Another advantage and essential of the present invention is that: if the semiconductor wafers to be processed have different sizes or there are different process requirements in such semiconductor processing apparatuses in the prior art, the whole component needs to be completely disassembled to replace the upper chamber plate 122 and the lower chamber plate 126 by matching ones. However, adopted in the present invention is a drawable lower box device 128 and a matching insert component 160, so that the lower chamber plate 126 can be loaded and removed conveniently. Replacement can be achieved just by the steps of: pulling out the old lower chamber plate 126 by sliding it along the guiding grooves of the lower box device 128, replacing it by a new lower chamber plate 126 having a proper size, sliding the new lower chamber plate 126 into the lower box device 128, and finally fixing the lower chamber plate 126 by the insert component 160. Similarly, after the bolts 154 and the correction plate 114 are disassembled, replacement of the upper chamber plate 122 can be carried out in a simple and convenient way.

Still another advantage and essential of the present invention is that: in such semiconductor processing apparatuses in the prior art, if the micro chamber is not tightly closed or properly sealed and the phenomena like leakage occurs in the micro pipes within the lower chamber plate during chemical processing, chemical agents or other fluids are likely to leak into the lower box device and are further likely to overflow the whole semiconductor apparatus. However, the bottom surface of the lower box device 128, adopted in the present invention, includes three side-by-side slope surfaces with the same tilt angle, tilt mode and width. Through the structure similar to that described in FIG. 7, the lower box device 128 can collect the leaked chemical agents at one side or one location of the bottoms of the slope surfaces 704, the chemical agents collected can be easily and timely detected by the sensors arranged at the slope bottoms, and the sensors give a signal in time to initiate the measures for continuous leakage prevention. And the leaked chemical agents are collected through the structures such as guiding grooves, pipelines and storage boxes, in order to avoid the chemical agents flowing outwards to reach the other parts of the apparatus to result in corrosion and contamination.

Still another advantage and essential of the present invention is that: in such semiconductor processing apparatuses in the prior art, the components of the column device 140 are typically made of integrally-formed metals by casting, on the one hand, the chemical processing fluids within the micro chamber sometimes generate corrosive and/or high-temperature gases during chemical processing, these corrosive gases will corrode the column devices when coming into contact with the metal column surfaces, on the other hand, the lower box device causes minor abrasion to the column devices while ascending and descending, so as to produce pollutant particles containing metal components. However, the column device 140 adopted in the present invention employs a structure of combining the column 1320 with the sleeve 1340, wherein the column 1320 can be made of integrally-formed metals by cutting or casting, and the sleeve 1340 can be made of corrosion-resistant and high-temperature-resistant materials such as plastics. Even if the column device 140 is abraded or corroded, only the sleeve 1340 needs to be replaced.

Meanwhile, it could be easily thought of from the description herein that, the upper chamber plate 122, the upper box device 124, the lower chamber plate 126 and the lower box device 128 that are possibly in direct contact with the chemical agents or other fluids should be made of corrosion-resistant and high-temperature-resistant materials, and other components can all be made of integrally-formed metals by cutting or casting.

On the other hand, the column 1320 is provided with a multi-step-shaped cylindrical column body and bolt holes, and other components can be fixed and engaged on the column device 140 very conveniently only by the corresponding screws and bolts.

The embodiments of the present invention have been fully disclosed in the foregoing description. It shall be noted that, any modifications made to the embodiments of the present invention by those skilled who are familiar with this art do not depart from the scope of the claims in the present invention. Accordingly, the scope of the claims in the present invention is not limited to the aforementioned embodiments.

What is claimed is:

1. A semiconductor processing apparatus, comprising:
    a micro chamber configured to accommodate and process a semiconductor wafer, the micro chamber comprising an upper chamber portion defining an upper working surface and a lower chamber portion defining a lower working surface, the upper chamber portion and the lower chamber portion being relatively movable along a primary moving direction between an open position for loading and removing the semiconductor wafer and a closed position for accommodating the semiconductor wafer,
    wherein, when the upper chamber portion or the lower chamber portion is in the closed position, the micro chamber is configured to allow the semiconductor wafer to be disposed between, and substantially sealed by, the upper working surface and the lower working surface,
    wherein an inner wall of the micro chamber comprises gaps thereon, the gaps configured to allow a fluid to flow therein,
    wherein at least one of the upper chamber portion or the lower chamber portion comprises at least one inlet and at least one outlet, the at least one inlet configured to allow the fluid to enter the micro chamber, the at least one outlet configured to discharge the fluid out of the micro chamber,
    wherein the lower chamber portion comprises a lower chamber plate, a lower box device and an insert component, the lower chamber plate defining the lower working surface,
    wherein the lower box device comprises an uncovered cavity having a top opening and a side opening, the uncovered cavity comprising a bottom surface substantially perpendicular to the primary moving direction and a plurality of side walls surrounding the bottom surface except for the side opening that opens toward a direction that is substantially perpendicular to the primary moving direction, each of the plurality of side walls having a recessed groove for receiving a respective edge of the lower chamber plate, the recessed groove substantially perpendicular to the primary moving direction, and
    wherein the lower chamber plate is fixedly disposed to the lower box device with the recessed groove of each of the plurality of side walls receiving the respective edge of the lower chamber plate, and with the insert component inserted into the side opening, such that the top opening of the uncovered cavity is substantially closed by the lower chamber plate.

2. The semiconductor processing apparatus of claim 1, wherein the lower chamber plate comprises a lower portion corresponding to the top opening of the uncovered cavity and an upper portion located above the lower portion, wherein an upper surface of the upper portion defines the lower working surface of the micro chamber, and wherein the top opening of the uncovered cavity is substantially closed by the lower portion.

3. The semiconductor processing apparatus of claim 1, wherein a surface of the uncovered cavity includes guiding grooves configured to lead the fluid to flow towards a predetermined direction.

4. The semiconductor processing apparatus of claim 3, wherein the guiding grooves comprise a plurality of side-by-side sloped surfaces positioned on the bottom surface of the uncovered cavity and having same tilt angle and tilt mode.

5. The semiconductor processing apparatus of claim 4, wherein bottoms of the sloped surfaces are located at the side opening and the bottoms of the sloped surfaces are connected with outlets of the guiding grooves.

6. The semiconductor processing apparatus of claim 1, further comprising a column device, wherein edges of the upper chamber portion and the lower chamber portion include corresponding column holes, and wherein one of the upper chamber portion and the lower chamber portion is moveable between the open position and the closed position under guidance of the column device running through the column holes.

7. The semiconductor processing apparatus of claim 6, wherein the upper chamber portion includes an upper chamber plate and an upper box device fixed on the column device, wherein the upper chamber plate includes an upper portion supported on the upper box device and a lower portion extending downwardly from the upper portion and passing through a middle cavity of the upper box device, and wherein a lower surface of the lower portion defines the upper working surface of the micro chamber.

8. The semiconductor processing apparatus of claim 7, further comprising bolts and a position correction device, wherein the position correction device includes a correction plate disposed above the upper portion of the upper chamber plate and a top plate fixed on the column device, wherein the top plate includes a plurality of threaded holes through which the bolts exert pressure on the correction plate to adjust a position or a shape of the lower chamber plate.

9. The semiconductor processing apparatus of claim 8, wherein the threaded holes are distributed in different positions of the top plate, and wherein, after the bolts are unscrewed, the correction plate can be removed from the upper chamber plate so that, subsequently, the upper chamber plate can be taken out.

10. The semiconductor processing apparatus of claim 6, wherein the upper chamber portion and the column device are relatively fixed, wherein the lower chamber portion is configured to move along the column device, wherein a drive device is provided under the lower chamber portion and is configured to provide an upward driving force driving the lower chamber portion to move from the open position to the closed position and to provide a downward driving force driving the lower chamber portion to move from the closed position to the open position.

11. The semiconductor processing apparatus of claim 10, wherein the drive device includes a drive and a telescopic cavity configured to receive the drive, and wherein the drive comprises a pneumatic drive, an electric drive, a mechanical drive, or a hydraulic drive.

12. The semiconductor processing apparatus of claim 10, wherein the column device includes a column and a sleeve, wherein the sleeve is sleeved on an outer surface of the column, and wherein an internal surface of the sleeve is attached to a part of the outer surface of the column.

13. The semiconductor processing apparatus of claim 12, wherein the column includes an upper portion, a first middle portion extending from the upper portion, a second middle portion extending from the first middle portion, and a bottom extending from the second middle portion,
wherein an outer surface of the upper portion includes a first screw thread, wherein an outer surface of the first middle portion includes a second screw thread, wherein an outer surface of the second middle portion includes a third screw thread, wherein an internal diameter of the sleeve is greater than or equal to an external diameter of the second middle portion of the column, wherein the sleeve is sleeved on the external diameter of the second middle portion of the column, wherein a shortest distance of a section of the bottom is greater than an external diameter of the sleeve which is greater than an internal diameter of the sleeve which is greater than the external diameter of the second middle portion which is greater than an external diameter of the first middle portion which is greater than an external diameter of the upper portion, and
wherein the semiconductor processing apparatus further comprises first nuts, second nuts, and third nuts, wherein a bottom of the drive device is fixed between the third nuts and the bottom of the column by the third nuts relative to the third screw thread, wherein the upper box device is fixed between the second nuts and an upper edge of the second middle portion of the column by the second nuts relative to the second screw thread, and wherein the top plate is fixed between the first nuts and an upper edge of the first middle portion of the column by the first nuts relative to the first screw thread.

14. A semiconductor processing apparatus, comprising:
a micro chamber configured to accommodate and process a semiconductor wafer, the micro chamber comprising an upper chamber portion defining an upper working surface and a lower chamber portion defining a lower working surface, the upper chamber portion and the lower chamber portion being relatively movable along a primary moving direction between an open position for loading and removing the semiconductor wafer and a closed position for accommodating the semiconductor wafer,
wherein, when the upper chamber portion or the lower chamber portion is in the closed position, the micro chamber is configured to allow the semiconductor wafer to be disposed between, and substantially sealed by, the upper working surface and the lower working surface,
wherein the lower chamber portion comprises a lower chamber plate, a lower box device and an insert component, the lower chamber plate defining the lower working surface,
wherein the lower box device comprises an uncovered cavity having a top opening and a side opening, the uncovered cavity comprising a bottom surface substantially perpendicular to the primary moving direction and a plurality of side walls surrounding the bottom surface except for the side opening that opens toward a direction that is substantially perpendicular to the primary moving direction, each of the plurality of side walls having a recessed groove for receiving a respective edge of the lower chamber plate, the recessed groove substantially perpendicular to the primary moving direction, and
wherein the lower chamber plate is fixedly disposed to the lower box device with the recessed groove of each of the plurality of side walls receiving the respective edge of the lower chamber plate, and with the insert component inserted into the side opening, such that the top opening of the uncovered cavity is substantially closed by the lower chamber plate.

15. The semiconductor processing apparatus of claim 14, wherein the lower chamber plate comprises a lower portion corresponding to the top opening of the uncovered cavity and an upper portion located above the lower portion, wherein an upper surface of the upper portion defines the lower working surface of the micro chamber, and wherein the top opening of the uncovered cavity is substantially closed by the lower portion.

16. The semiconductor processing apparatus of claim 14, further comprising a plurality of column devices, wherein each of the upper chamber portion and the lower chamber portion further comprises a plurality of column holes each corresponding to a respective one of the plurality of column devices, wherein each of the plurality of column devices goes through the corresponding column hole of the upper chamber portion and the lower chamber portion, and wherein one of the upper chamber portion and the lower chamber portion is moveable between the open position and the closed position under guidance of the plurality of column devices.

17. The semiconductor processing apparatus of claim 16, wherein the upper chamber portion further comprises an upper chamber plate and an upper box device fixedly disposed on the plurality of column devices, wherein the upper chamber plate comprises an upper portion fixedly disposed to the upper box device and a lower portion extending downwardly from the upper portion and passing through a middle cavity of the upper box device, and wherein a lower surface of the lower portion defines the upper working surface of the micro chamber.

18. The semiconductor processing apparatus of claim 17, further comprising a plurality of bolts and a position correction device, wherein the position correction device comprises a correction plate disposed above the upper portion of the upper chamber plate and a top plate fixedly disposed on the plurality of column devices, wherein the top plate comprises a plurality of threaded holes through which the bolts exert pressure on the correction plate to adjust a position or a shape of the lower chamber plate.

19. The semiconductor processing apparatus of claim 16, wherein the upper chamber portion is fixedly disposed to the plurality of column devices, wherein the lower chamber portion is configured to move along the plurality of column devices, wherein a drive device is provided under the lower chamber portion and is configured to provide an upward driving force to drive the lower chamber portion from the open position to the closed position or a downward driving force to drive the lower chamber portion from the closed position to the open position.

\* \* \* \* \*